(12) United States Patent
Jiang et al.

(10) Patent No.: US 9,947,691 B2
(45) Date of Patent: Apr. 17, 2018

(54) ARRAY SUBSTRATE, MANUFACTURING METHOD THEREOF AND DISPLAY PANEL

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Xuebing Jiang, Beijing (CN); Lin Lin, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/435,913

(22) PCT Filed: Aug. 15, 2014

(86) PCT No.: PCT/CN2014/084530
§ 371 (c)(1),
(2) Date: Apr. 15, 2015

(87) PCT Pub. No.: WO2015/123975
PCT Pub. Date: Aug. 27, 2015

(65) Prior Publication Data
US 2016/0027801 A1    Jan. 28, 2016

(30) Foreign Application Priority Data
Feb. 19, 2014   (CN) .......................... 2014 1 0057337

(51) Int. Cl.
*H01L 27/12*    (2006.01)
*H01L 21/77*    (2017.01)
(Continued)

(52) U.S. Cl.
CPC ........ *H01L 27/124* (2013.01); *G02F 1/13624* (2013.01); *H01L 21/77* (2013.01);
(Continued)

(58) Field of Classification Search
CPC ..................................................... H01L 27/124
See application file for complete search history.

(56) References Cited

U.S. PATENT DOCUMENTS

| 5,410,164 A | 4/1995 | Katayama et al. |
| 5,729,308 A | 3/1998 | Yamazaki et al. |

(Continued)

FOREIGN PATENT DOCUMENTS

| CN | 1550859 A | 12/2004 |
| CN | 102473736 A | 5/2012 |

(Continued)

OTHER PUBLICATIONS

International Search Report Appln. No. PCT/CN2014/084530; dated Nov. 19, 2014.

(Continued)

*Primary Examiner* — Eugene Lee
(74) *Attorney, Agent, or Firm* — Ladas & Parry LLP

(57) ABSTRACT

An array substrate, a manufacturing method thereof and a display panel are disclosed. The array substrate comprises: a base substrate (200) and gate lines (202), data lines (205) and a plurality of pixel units (20). Each pixel unit (20) includes a first thin-film transistor (TFT), a pixel electrode (208) and at least second TFT connected in series with the first TFT. The pixel electrode (208) is connected with a drain electrode (207) of the second TFT; a source electrode (206') of the second TFT is connected with a drain electrode (207) of the first TFT; and a source electrode (206) of the first TFT is connected with the data line (205). The array substrate can reduce the leakage current when the TFTs are switched off.

7 Claims, 7 Drawing Sheets

(51) Int. Cl.
*H01L 29/786* (2006.01)
*G02F 1/1362* (2006.01)
*H01L 29/04* (2006.01)
*H01L 29/16* (2006.01)
*H01L 29/22* (2006.01)
*H01L 29/24* (2006.01)
*H01L 29/66* (2006.01)

(52) U.S. Cl.
CPC .......... *H01L 27/12* (2013.01); *H01L 27/1222* (2013.01); *H01L 27/1225* (2013.01); *H01L 27/1248* (2013.01); *H01L 27/1288* (2013.01); *H01L 29/04* (2013.01); *H01L 29/16* (2013.01); *H01L 29/22* (2013.01); *H01L 29/24* (2013.01); *H01L 29/66765* (2013.01); *H01L 29/66969* (2013.01); *H01L 29/786* (2013.01); *H01L 29/7869* (2013.01); *H01L 29/78678* (2013.01)

(56) References Cited

U.S. PATENT DOCUMENTS

| | | | | |
|---|---|---|---|---|
| 6,255,695 | B1* | 7/2001 | Kubota | H01L 29/41733 257/351 |
| 6,420,758 | B1* | 7/2002 | Nakajima | H01L 29/4908 257/350 |
| 6,492,659 | B1* | 12/2002 | Yamazaki | H01L 27/1281 257/349 |
| 6,774,573 | B2* | 8/2004 | Yamazaki | G09G 3/3233 315/169.1 |
| 6,841,827 | B2 | 1/2005 | Koga | |
| 8,723,260 | B1* | 5/2014 | Carroll | H01L 21/84 257/347 |
| 9,362,273 | B2* | 6/2016 | Arao | H01L 27/1214 |
| 2003/0112383 | A1 | 6/2003 | Kim | |
| 2007/0114530 | A1* | 5/2007 | Kimura | G09G 3/3225 257/59 |
| 2007/0194316 | A1* | 8/2007 | Choi | G09G 3/3225 257/69 |
| 2007/0195248 | A1* | 8/2007 | Huh | G02F 1/13624 349/139 |
| 2008/0006827 | A1 | 1/2008 | Shim et al. | |
| 2008/0013007 | A1* | 1/2008 | Yokoyama | G09G 3/3659 349/39 |
| 2012/0146038 | A1 | 6/2012 | Kitakado | |
| 2012/0146043 | A1 | 6/2012 | Kitakado | |
| 2014/0008656 | A1 | 1/2014 | Shim et al. | |
| 2015/0037955 | A1* | 2/2015 | Son | H01L 27/1251 438/275 |
| 2015/0295091 | A1 | 10/2015 | Cao et al. | |

FOREIGN PATENT DOCUMENTS

| | | |
|---|---|---|
| CN | 102484136 A | 5/2012 |
| CN | 103187423 A | 7/2013 |
| CN | 103529608 A | 1/2014 |
| CN | 103811503 A | 5/2014 |
| CN | 203707132 U | 7/2014 |
| JP | 08204207 A | 8/1996 |

OTHER PUBLICATIONS

Written Opinion of the International Searching Authority Appln. No. PCT/CN2014/084530; dated Nov. 19, 2014.
First Chinese Office Action dated Nov. 30, 2015; Appln. No. 201410057337.6.
Second Chinese Office Action dated Apr. 25, 2016; Appln. No. 201410057337.6.

* cited by examiner

ARRAY SUBSTRATE, MANUFACTURING METHOD THEREOF AND DISPLAY PANEL

TECHNICAL FIELD

At least one embodiment of the present invention relates to an array substrate, a manufacturing method thereof and a display panel.

BACKGROUND

The electric current leakage path of thin-film transistors (TFTs) mainly includes liquid crystal capacitor leakage and TFT leakage. The former is that current is leaked from a pixel electrode to a common electrode, and the latter is that current is leaked from a pixel electrode to a data line. Thus, the leakage of the latter is related to the voltage on the data line. In a leakage current conduction mechanism of a TFT device, hole current mainly formed by channel thermionic emission, for instance, leakage current of amorphous silicon (a-Si) products, will greatly increase under the condition of illumination.

Indium gallium zinc oxide (IGZO) is a new material for preparing active layers of TFTs. Firstly, IGZO transistors have smaller size, so that the device can be thinner. Secondly, IGZO transistors are fully transparent and not sensitive to visible light and hence can greatly increase the aperture ratio of components, improve the brightness and reduce the power consumption. In addition, in the aspect of electron mobility, the mobility of IGZO carriers is 5 to 10 times of that of a-Si. The threshold voltage shift is almost consistent and improved by 20 to 50 times compared with a-Si materials. Thus, the on-state current characteristic is good and the progress is very remarkable. Moreover, IGZO panels have an overall improvement in main performance parameters of panels compared with a-Si TFT panels.

In order to reduce the optical contact area of oxide active layers (e.g., IGZO active layers) and reduce the light-induced leakage current, oxide TFTs generally adopts light shield structures. As illustrated in FIGS. 1 and 2, a gate line 102 is disposed below an oxide active layer 104, a source electrode 106 and a drain electrode 107, so that the gate line 102 can shield the oxide active layer 104 formed in the channel between the source electrode 106 and the drain electrode 107, and hence the possibility of the production of electron-hole pairs in the case of illumination can be effectively reduced. Thus, the leakage current (off-state current) is less affected by illumination.

SUMMARY

At least one embodiment of the present invention provides an array substrate, a manufacturing method thereof and a display panel to reduce the leakage current when TFTs are switched off.

At least one embodiment of the present invention provides an array substrate, which comprises: a base substrate and a gate line, a data line and a plurality of pixel units disposed on the base substrate. Each pixel unit includes a first TFT, a pixel electrode and at least one second TFT connected in series with the first TFT; the pixel electrode is connected with a drain electrode of the second TFT; a source electrode of the second TFT is connected with a drain electrode of the first TFT; and a source electrode of the first TFT is connected with the data line.

At least one embodiment of the present invention further provides a display panel, which comprises the foregoing array substrate.

At least one embodiment of the present invention further provides a method for manufacturing an array substrate. The method comprises: forming gate lines, data lines and a plurality of pixel units by patterning process. Each pixel unit includes a first TFT, a pixel electrode and at least one second TFT connected in series with the first TFT; the pixel electrode is connected with a drain electrode of the second TFT; a source electrode of the second TFT is connected with a drain electrode of the first TFT; and a source electrode of the first TFT is connected with the data line.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

REFERENCE NUMERALS

100: Base Substrate; 101: Common Electrode Layer; 102: Gate Line/Gate Electrode; 103: Common Electrode Line; 104: First Oxide Active Layer; 105: Data Line; 106: First Source Electrode; 107: First Drain Electrode; 108: Slit on the Pixel Electrode; 109: Pixel Electrode; 110: Gate Insulating Layer; 111: Etching barrier layer; 112: Passivation Layer; 20: Pixel Unit; 200: Base Substrate; 201: Common Electrode Layer; 202: Gate Line/Gate Electrode; 203: Common Electrode Line; 204: First Oxide Active Layer; 204': Second Oxide Active Layer; 205: Data Line; 206: First Source Electrode; 206': Second Source Electrode; 207: First Drain Electrode; 207': Second Drain Electrode; 208: Pixel Electrode Layer; 209: Slit on the Pixel Electrode Layer; 210: Gate Insulating Layer; 211: Etching barrier layer; 212: Passivation Layer.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Unless otherwise specified, the technical terms or scientific terms used in the disclosure have normal meanings understood by those skilled in the art. The words "first", "second" and the like used in the disclosure do not indicate the sequence, the number or the importance but are only used for distinguishing different components. Similarly, the words "a", "an", "the" and the like also do not indicate the number but only indicate at least one. The word "comprise", "include" or the like only indicates that an element or a component before the word contains elements or components listed after the word and equivalents thereof, not excluding other elements and components. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed.

Figure 1:
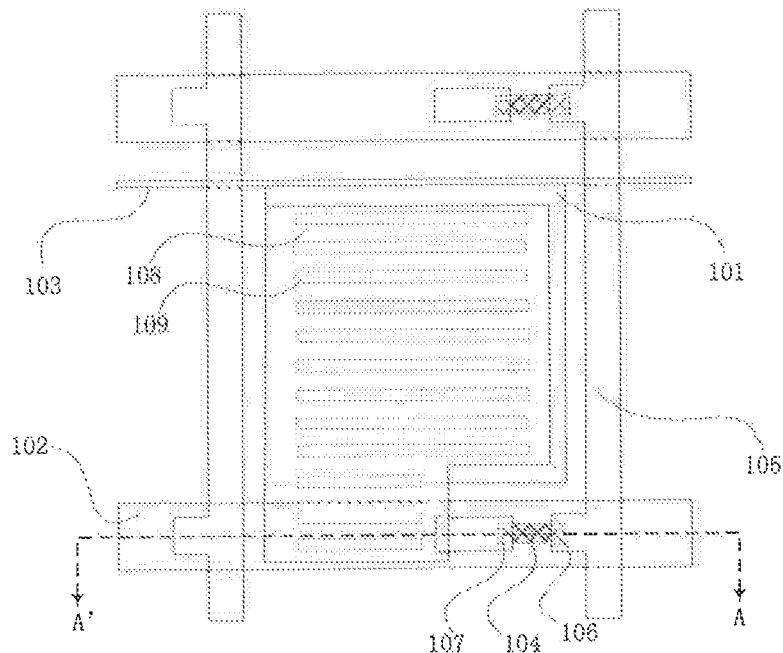
FIG. 1 is a schematic structure top view of an oxide TFT array substrate.
Figure 2:
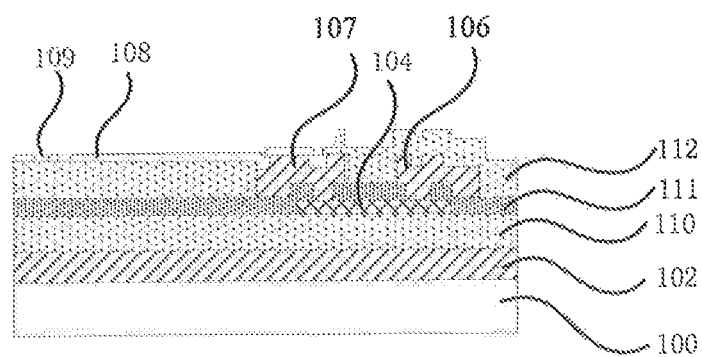
FIG. 2 is a schematic structure sectional view of the oxide TFT array substrate as shown in FIG. 1 along direction A-A' on a gate line.

The inventors of the application have noted that: in an oxide TFT having a light shield structure as shown in FIGS. 1 and 2, a source electrode 106 and a drain electrode 107 make direct contact with an oxide active layer 104, which will increase the possibility of the phenomenon that holes in the oxide active layer 104 flow into the source electrode 106 and the drain electrode 107 and electrons in the source electrode 106 and the drain electrode 107 flow into the active layer 104. Thus, the leakage path "drain electrode—oxide active layer—source electrode" will be enhanced, which is not helpful to keep stored charges, and hence the image quality of panels can be degraded.

At least one embodiment of the present invention illustratively describes in detail the structure of the TFT array substrate by taking the structure of an advanced dimension switch (ADS) oxide TFT array substrate as an example.

In at least one embodiment of the present invention, a first oxide TFT is the real oxide TFT; a first source electrode and a first drain electrode are the source electrode and the drain electrode of the real oxide 'TFT'; a second oxide TFT is a virtual oxide TFT provided by at least one embodiment of the present invention; and a second source electrode and a second drain electrode are the source electrode and the drain electrode of the virtual oxide TFT. The example that the array substrate comprises a first oxide TFT and a second oxide TFT is illustrated in the accompanying drawings of the following embodiments, but the embodiments of the present invention are not limited thereto. For instance, the array substrate provided by an embodiment of the present invention may further comprise two or more than two second oxide TFTs.

Figure 3:
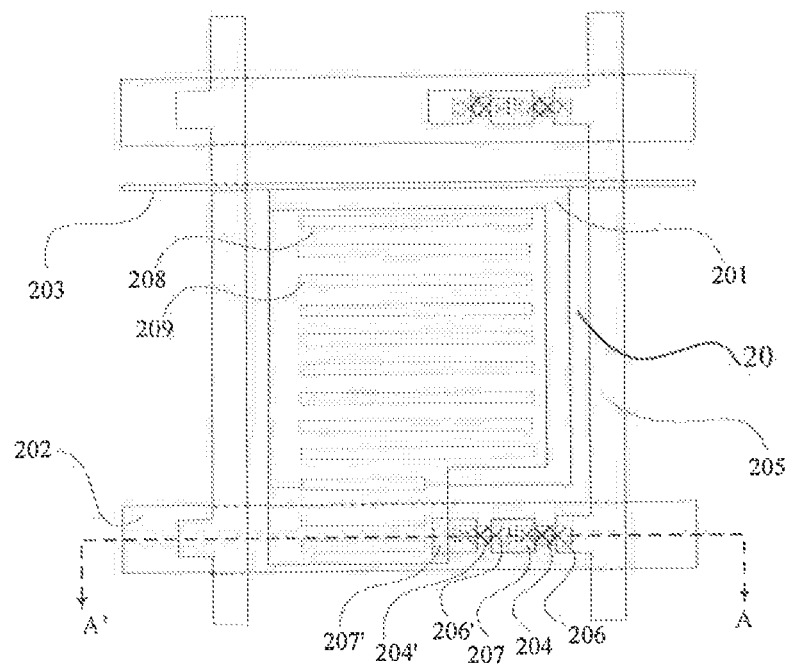
FIG. 3 is a schematic structure top view of an oxide TFT array substrate provided by an embodiment of the present invention.
Figure 4:
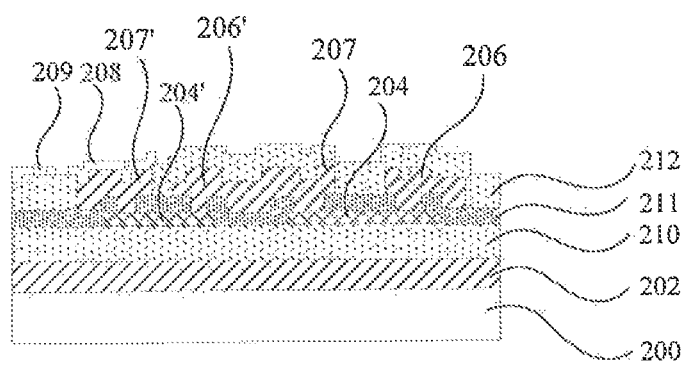
FIG. 4 is a schematic structure sectional view of the oxide TFT array substrate provided by an embodiment of the present invention along direction A-A' on a gate line.

As illustrated in FIGS. 3 and 4, at least one embodiment of the present invention provides an oxide TFT array substrate, which comprises: a base substrate 200 and gate lines 202, data lines 205 and a plurality of pixel units 20 disposed on the base substrate 200. Each pixel unit 20 includes a first oxide TFT and a pixel electrode 208 and further includes at least one second oxide TFT connected in series with the first oxide TFT. The pixel electrode 208 is connected with a second drain electrode 207T; a second source electrode 206' is connected with a first drain electrode 207; and a first source electrode 206 is connected with a data line 205.

Figure 12:
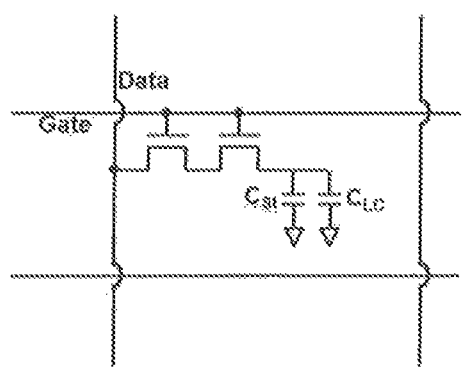
FIG. 12 is a schematic circuit diagram of the oxide TFT array substrate provided by an embodiment of the present invention.

In the oxide TFT array substrate, second oxide TFT's are additionally arranged on the basis of the array substrate comprising the first oxide TFTs only. The function of the additionally arranged second oxide TFT is that: the second oxide TFT increases the off-state resistance between the pixel electrode 208 and the data line 205, can inhibit the possibility of the phenomenon that holes in a first oxide active layer 204 flow into the first drain electrode 207 and electrons in the first drain electrode 207 flow into the first oxide active layer 204, and hence can effectively inhibit the leakage path "drain electrode—oxide active layer—source electrode" and improve the display quality of panels. As illustrated in FIG. 12, the second oxide TFT connected in series with the first oxide TFT can increase the off-state resistance ($R_{off1}+R_{off2}>R_{off1}$) of the TFT and reduce the leakage current.

In the array substrate provided by one embodiment, oxide active layers of the first oxide TFT and the second oxide TFT are disposed on the base substrate: a source electrode and a drain electrode of the first oxide TFT and a source electrode and a drain electrode of the second oxide TFT are respectively disposed on the oxide active layers of the first oxide TFT and the second oxide TFT; and the drain electrode of the second oxide TFT is connected with the pixel electrode, extended to the drain electrode of the second oxide TFT, in the pixel unit.

For instance, the array substrate may be a bottom-gate oxide TFT array substrate and may comprises: a base substrate 200; a gate line 202 disposed on the base substrate 200; a gate insulating layer 210 disposed on the gate line 202; a first oxide active layer pattern 204 and a second oxide active layer pattern 204' disposed on the gate insulating layer 210 and over the gate line 202; an etching barrier layer pattern 211 disposed on the first oxide active layer pattern 204 and the second oxide active layer pattern 204'; and a first source electrode pattern 206, a first drain electrode pattern 207, a second source electrode pattern 206' and a second drain electrode pattern 207' disposed on the etching barrier layer pattern 211, in which the first source electrode pattern 206 and the first drain electrode pattern 207 are connected with the active layer pattern 204 of the first oxide TFT via a through hole in the etching barrier layer pattern 211, and the second source electrode pattern 206' and the second drain electrode pattern 207 are connected with the active layer pattern 204' of the second oxide TFT via a through hole in the etching barrier layer pattern 211; and a passivation layer 212 disposed on the source electrode and the drain electrode and provided with a through hole therein. The second drain electrode 207 is connected with the pixel electrode layer 208, extended to the second drain electrode 207', in the pixel unit 20.

It should be noted that the etching barrier layer 211 is provided with through holes therein to prevent the contact between the source electrode and the drain electrode and the oxide active layer. In the process of manufacturing the oxide TFT array substrate, the etching barrier layer 211 is configured to prevent the oxide active layers in channels formed between the source electrodes and the drain electrodes from being etched in the process of forming the source electrodes and the drain electrodes. The etching barrier layer 211 at least covers the channel between the first source electrode 206 and the first drain electrode 207 and the channel between the second source electrode 206' and the second drain electrode 207'. FIG. 4 illustratively describes the case that other areas of the gate electrode 202, except areas where the source electrodes/drain electrodes make contact with the oxide active layers, are all covered by the etching barrier layer 211. In an actual manufacturing process, the pattern of the etching barrier layer 211 may be determined by actual manufacturing process and requirement. No specific limitation will be given in the embodiment of the present invention. In addition, the etching barrier layer may also be not disposed in the embodiment of the present invention, but the function the same as that of the etching barrier layer is achieved by, for instance, a source-drain transition layer. For instance, the source-drain transition layer may be made from a heavily doped semiconductor material of elements such as B and Si. No limitation will be given here.

Figure 13:
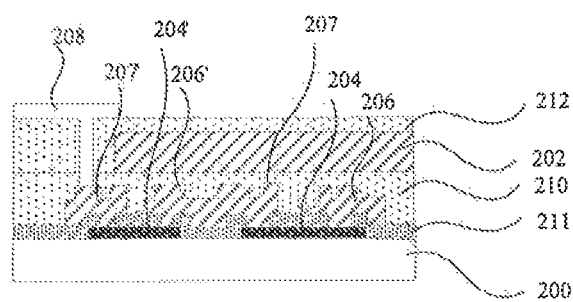
FIG. 13 is a schematic structure sectional view of the oxide TFT array substrate provided by an embodiment of the present invention along direction A-A' on a gate line.

It should be noted that the structure of the TFT array substrate as shown in FIGS. 3 and 4 is only described by taking a bottom-gate structure of an ADS oxide TFT array substrate as an example. But the embodiments of the present invention are not limited to TFT array substrates adopting bottom-gate structures and are also adapted to TFT array substrates adopting top-gate structures, etc., as shown in FIG. 13.

It can be easily known by those skilled in the art that the bottom-gate oxide TFT array substrate provided by the embodiment of the present invention may be easily modified into a top-gate oxide TFT array substrate. For instance, as shown in FIG. 13, the top-gate oxide TFT array substrate may comprise: a base substrate 200; a first oxide active layer pattern 204 and a second oxide active layer pattern 204' disposed on the base substrate 200; an etching barrier layer pattern 211 disposed on the first oxide active layer pattern 204 and the second oxide active layer pattern 204'; a first source electrode pattern 206, a first drain electrode pattern 207, a second source electrode pattern 206' and a second drain electrode pattern 207' disposed on the etching barrier layer pattern 211, in which the first source electrode pattern 206 and the first drain electrode pattern 207 are connected with the active layer pattern 204 of the first oxide TFT via a through hole in the etching barrier layer pattern 211 and the second source electrode pattern 206' and the second drain electrode pattern 207' are connected with the active layer pattern 204' of the second oxide TFT via a through hole in the etching barrier layer pattern 211; a gate insulating layer 210 disposed on the source electrode and the drain electrode; a gate line 202 disposed on the gate insulating layer 210; and a passivation layer 212 disposed on the gate line 202 and provided with a through hole therein. The second drain electrode 207' is connected with a pixel electrode layer 208, extended to the second drain electrode 207', in a pixel unit. Of course, the structure of the oxide TFT array substrate provided by the embodiments of the present invention is not limited to the structure of the oxide TFT array substrate provided by the embodiment. No further description will be given herein.

In one embodiment, the array substrate may further comprise: a common electrode 201 and a common electrode line 203 disposed on the base substrate 200. The common electrode line 203 and the common electrode 201 are connected with each other.

In a different embodiment, the common electrode 201 and the pixel electrode 208 may be arranged on different layers. The pixel electrode 208 or the common electrode 201 disposed on a relatively upper layer includes a slit structure, and the common electrode 201 or the pixel electrode 208 disposed on a relatively lower layer includes a slit structure or a plate structure. For instance, when the pixel electrode is disposed on the relatively upper layer and the common electrode is disposed on the relatively lower layer, both the pixel electrode and the common electrode may include a slit structure, or the pixel electrode includes a slit structure and the common electrode includes a plate structure. Or in one embodiment, the common electrode 201 and the pixel electrode 208 may be arranged on the same layer, and both the pixel electrode 208 and the common electrode 201 include a slit structure.

In addition, it should be noted that the structure of the TFT array substrate as shown in FIGS. 3 and 4 is only described by taking an ADS oxide TFT array substrate as an example. But the embodiments of the present invention are not limited to the ADS oxide TFT array substrate and are also adapted to twisted nematic (TN) TFT array substrates in which the first source electrode 206 and the first drain electrode 207 make direct contact with the active layer 204 of the first oxide TFT. No specific limitation will be given in the embodiment of the present invention.

In one embodiment, the oxide active layer is made from IGZO. But the embodiments of the present invention are not limited thereto. For instance, the oxide active layer may also be made from IZO, ZnO, etc.

In the oxide TFT array substrate provided by the embodiment of the present invention, as the second oxide TFTs are additionally arranged on the basis of the array substrate comprising the first oxide TFTs only, the second oxide TFT increases the off-state resistance between the pixel electrode and the data line, can inhibit the leakage path "drain electrode—oxide active layer—source electrode", and hence can improve the display quality of panels. In another aspect, the second oxide TFT connected in series with the first oxide TFT can increase the off-state resistance ($R_{off1}+R_{off2}>R_{off1}$) of the TFT and reduce the leakage current.

It should be noted that description is given in the above embodiments by only taking an array substrate employing oxide TFTs as an example, but the embodiments of the present invention are not limited thereto and are adapted to any case in which at least two TFTs may be connected in series to prevent the leakage path "drain electrode—oxide active layer—source electrode". For instance, in the embodiment of the present invention, poly-Si TFTs, e.g., low-temperature polycrystalline silicon (LTPS) or high-temperature polycrystalline silicon (HTPS) TFTs, may also be adopted. Both the poly-Si TFTs and the oxide TFTs have high electron mobility, which is more helpful for the realization of the series connection between the TFTs. When the array substrate adopts the poly-Si TFTs, the structure of the array substrate is similar to the structure of the array substrate adopting the oxide TFTs provided by the embodiment of the present invention. No further description will be given here.

On the basis of the oxide TFT array substrate, at least one embodiment of the present invention further provides a display panel, which comprises the foregoing TFT array substrate. For instance, the display panel may be a liquid crystal display (LCD) panel, an organic light-emitting diode (OLED) display panel, a touch panel, etc.

On the basis of the above TFT array substrate (e.g., the oxide TFT array substrate), at least one embodiment of the present invention further provides a method for manufacturing the TFT array substrate. Description will be given below to the manufacturing method by taking the oxide TFT array substrate as an example. The method comprises: forming gate lines 202, data lines 205 and a plurality of pixel units 20 on a base substrate by patterning processes. Each pixel unit 20 includes a first oxide TFT and a pixel electrode 208 and further includes at least one second oxide TFT connected in series with the first oxide TFT. A pixel electrode 208 is connected with a second drain electrode 207; a second source electrode 206' is connected with a first drain electrode 207; and a first source electrode 206 is connected with the data line 205.

In the method for manufacturing the oxide TFT array substrate, provided by one embodiment, patterns of active layers of first oxide TFTs and active layers of second oxide TFTs are formed on a base substrate; patterns of source electrodes and drain electrodes of the first oxide TFTs and source electrodes and drain electrodes of the second oxide TFTs are formed on the base substrate provided with the patterns of the active layers of the first oxide TFTs and the active layers of the second oxide TFTs; and patterns of pixel electrodes are formed on the base substrate provided with the source electrodes and the drain electrodes of the first oxide TFTs and the source electrodes and the drain electrodes of the second oxide TFTs, and the pixel electrodes are extended to and connected with the drain electrodes of the second oxide TFTs. In one embodiment, the manufacturing method may further comprise: forming a pattern of an etching barrier layer on the base substrate.

For instance, detailed description is given in the embodiment of the present invention by taking a method for manufacturing a bottom-gate ADS oxide TFT array substrate as an example. The method may be described as follows. It should be noted that a patterning processes in an embodiment of the present invention includes primary processes such as exposure, development, etching, ashing and so on.

S1: forming patterns of common electrodes 201, gate lines 202 and common electrode lines 203 on a base substrate 200 by a first patterning process.

Figure 5:
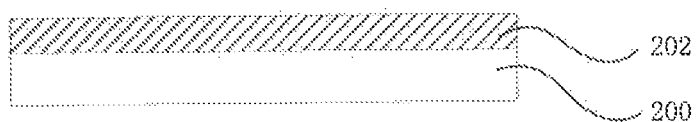
FIG. 5 is a schematic structure view of a product obtained after a first patterning process in a method for manufacturing an oxide TFT array substrate, provided by an embodiment of the present invention.
Figure 11A:
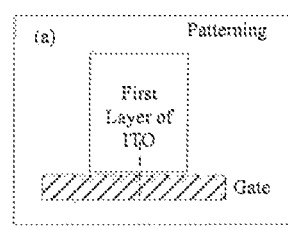
FIGS. 11(a) to 11(h) are flowcharts of the oxide TFT array substrate provided by an embodiment of the present invention (half-tone mask technology)
Figure 11B:
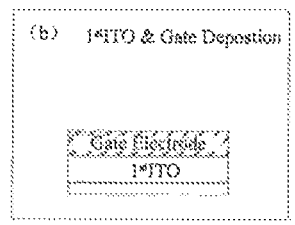
Figure 11C:
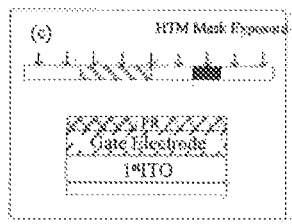
Figure 11D:
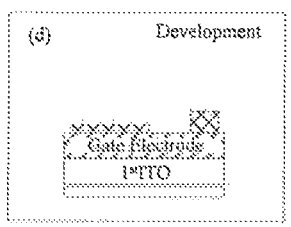
Figure 11E:
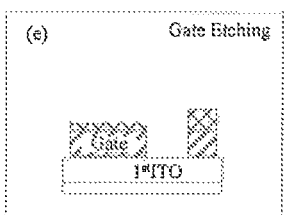
Figure 11F:
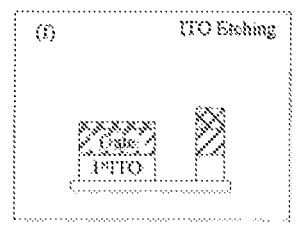
Figure 11G:
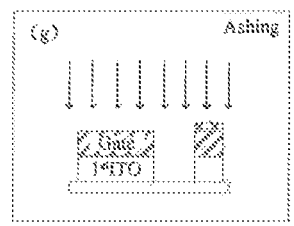
Figure 11H:
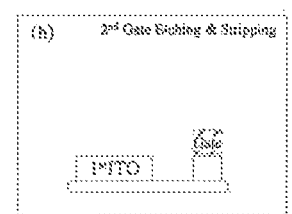

For instance, in the first patterning process, a gate metal layer film is applied on the base substrate 200 first, and then photoresist is formed on the base substrate 200 coated with the gate metal layer film. As illustrated in FIG. 11(a), after the photoresist is subjected to exposure and development with a half-tone mask, a photoresist-retained region (including a photoresist-partially-retained region and a photoresist-completely-retained region) and a photoresist-completely-removed region are formed. The photoresist-retained region corresponds to regions of the common electrode 201, the gate line 202 and the common electrode line 203. The photoresist-completely-removed region corresponds to regions, except the photoresist-retained region, in the pixel unit 20. Firstly, the gate metal layer film and an ITO film beneath the gate metal layer film, in the photoresist-completely-removed region, are removed in an etching process. Secondly, the photoresist in the photoresist-partially-retained region is stripped off by ashing process, but photoresist with a partial thickness is retained in the photoresist-completely-retained region. Thirdly, the etching process is performed again to remove the gate metal layer film corresponding to the original photoresist-partially-retained region so as to expose the ITO film beneath the gate metal layer film. Finally, the remaining photoresist is removed to form the patterns of the common electrode 201, the gate line 202 and the common electrode line 203 as shown in FIG. 11(a). As illustrated in FIG. 5, the pattern of the gate line 202 is exposed to obtain the gate line 202.

S2: forming patterns of a gate insulating layer 210, a first oxide active layer 204 and a second oxide active layer 204' on the base substrate 200, obtained after the first patterning process, by a second patterning process. For instance, the patterns of the oxide active layers are disposed over the gate line 202.

Figure 6:
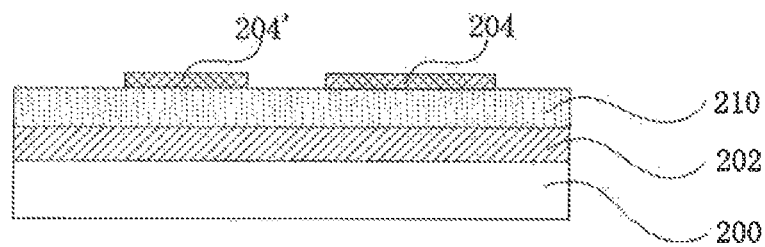
FIG. 6 is a schematic structure view of a product obtained after a second patterning process in the method for manufacturing the oxide TFT array substrate, provided by an embodiment of the present invention.

For instance, in the second patterning process, a gate insulating layer film and an oxide active layer film are applied onto the base substrate 200 obtained after the first patterning process at first, and then photoresist is formed on the base substrate 200 coated with the gate insulating layer film and the oxide active layer film. After the photoresist is subjected to exposure and development via a mask, a photoresist-completely-retained region and a photoresist-completely-removed region are formed. The photoresist-completely-retained region corresponds to regions of the active layer 204 of the first oxide TFT and the active layer 204' of the second oxide TFT. The photoresist-completely-removed region corresponds to regions, except the photoresist-completely-retained region, in the pixel unit 20. The oxide active layer film in the photoresist-completely-removed region is removed by an etching process, and then the photoresist in the photoresist-completely-retained region is stripped off by an ashing process. As illustrated in FIG. 6, the patterns of the active layer 204 of the first oxide TFT and the active layer 204' of the second oxide TFT are exposed to form the gate insulating layer 210 and the oxide active layers.

S3: forming a pattern of an etching barrier layer 211 on the base substrate 200, obtained after the second patterning process, by a third patterning process.

Figure 7:
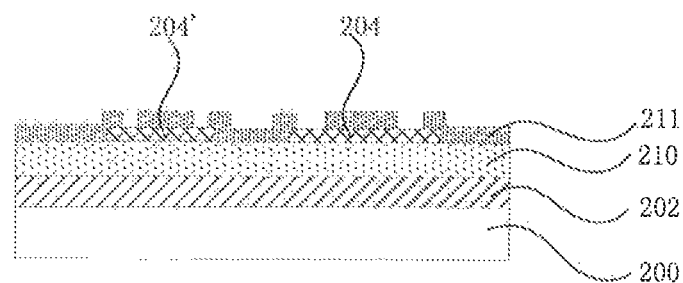
FIG. 7 is a schematic structure view of a product obtained after a third patterning process in the method for manufacturing the oxide TFT array substrate, provided by an embodiment of the present invention.

For instance, in the third patterning process, an etching barrier layer film is applied onto the base substrate 200 obtained after the second patterning process at first, and then photoresist is formed on the base substrate 200 coated with the etching barrier layer film. After the photoresist is subjected to exposure and development via a mask, a photoresist-completely-retained region and a photoresist-completely-removed region are formed. The photoresist-completely-retained region corresponds to a region of the etching barrier layer 211. The photoresist-completely-removed region corresponds to regions, except the photoresist-completely-retained region, in the pixel unit 20. The etching barrier layer film on the photoresist-completely-removed region is removed by an etching process, and then the photoresist in the photoresist-completely-retained region is stripped off by an ashing process. As illustrated in FIG. 7, the pattern of the etching barrier layer 211 is exposed to form the etching barrier layer 211.

S4: forming patterns of a data line 205, a first source electrode 206, a first drain electrode 207, a second source electrode 206' and a second drain electrode 207' on the base substrate 200, obtained after the third patterning process, by a fourth patterning process.

Figure 8:
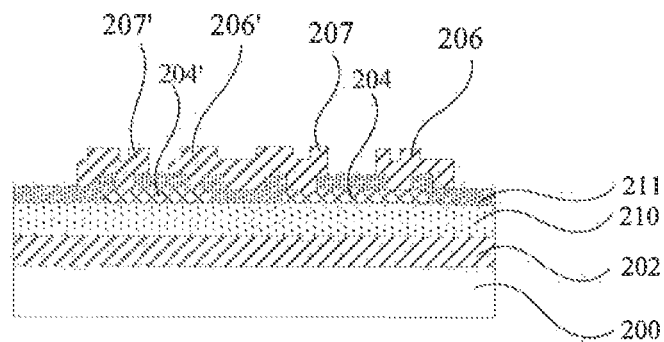
FIG. 8 is a schematic structure view of a product obtained after a fourth patterning process in the method for manufacturing the oxide TFT array substrate, provided by an embodiment of the present invention.
Figure 9:
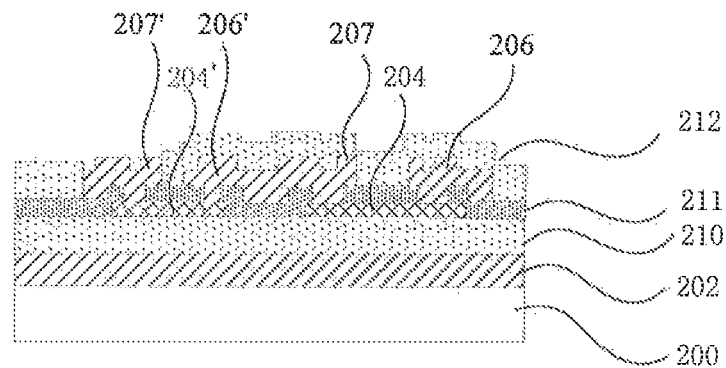
FIG. 9 is a schematic structure view of a product obtained after a fifth patterning process in the method for manufacturing the oxide TFT array substrate, provided by an embodiment of the present invention

For instance, in the fourth patterning process, a source/drain metal layer film is coated on the base substrate 200 obtained after the third patterning process at first, and then photoresist is formed on the base substrate 200 coated with the source/drain metal layer film. After the photoresist is subjected to exposure and development via a mask, a photoresist-completely-retained region and a photoresist-completely-removed region are formed. The photoresist-completely-retained region corresponds to regions of the data line 205, the first source electrode 206, the first drain electrode 207, the second source electrode 206' and the second drain electrode 207. The photoresist-completely-removed region corresponds to regions, except the photoresist-completely-retained region, in the pixel unit 20. The source/drain metal layer film on the photoresist-completely-removed region is removed by an etching process, and then the photoresist in the photoresist-completely-retained region is stripped off by an ashing process to form the patterns of the data line 205, the first source electrode 206, the first drain electrode 207, the second source electrode 206' and the second drain electrode 207 as shown in FIG. 3. As illustrated in FIG. 8, the patterns of the source electrodes and the drain electrodes are exposed to form the source electrodes and the drain electrodes.

S5: forming a pattern of a passivation layer 212 on the base substrate 200, obtained after the fourth patterning process, by a fifth patterning process.

For instance, in the fifth patterning process, a passivation layer film is coated on the base substrate 200 obtained after the fourth patterning process at first, and then photoresist is formed on the base substrate 200 coated with the passivation layer film. After the photoresist is subjected to exposure and development via a mask, a photoresist-completely-retained region and a photoresist-completely-removed region are formed. The photoresist-completely-retained region corresponds to a region of the passivation layer 212. The photoresist-completely-removed region corresponds to regions, except the photoresist-completely-retained region, in the pixel unit 20. For instance, the photoresist-completely-removed region includes a gate line lead through hole and a data line lead through hole. The passivation layer film in the photoresist-completely-removed region is removed by an etching process, and then the photoresist in the photoresist-completely-retained region is stripped off by an ashing process. As illustrated in FIG. 8, the pattern of the passivation layer 207, the gate line lead through hole and the data line lead through hole are formed. The gate line lead through hole and the data line lead through hole are not shown in the figure.

S6: forming a pattern of a pixel electrode 208 on the base substrate 200, obtained after the fifth patterning process, by a sixth patterning process, in which the pixel electrodes 208 are extended to and connected with the second drain electrodes 207'.

Figure 10:
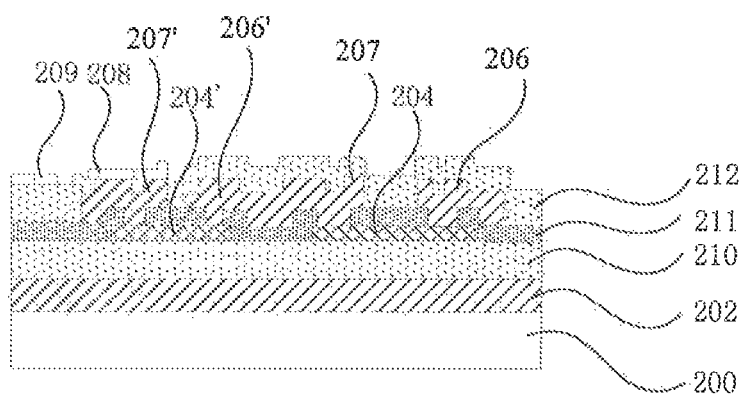
FIG. 10 is a schematic structure view of a product obtained after a sixth patterning process in the method for manufacturing the oxide TFT array substrate, provided by an embodiment of the present invention

For instance, in the sixth patterning process, a transparent conductive layer film is applied on the base substrate 200 obtained after the fifth patterning process at first, and then photoresist is formed on the base substrate 200 coated with the transparent conductive layer film. After the photoresist is subjected to exposure and development via a mask, a photoresist-completely-retained region and a photoresist-completely-removed region are formed. The photoresist-completely-retained region corresponds to a region of the pixel electrode 208. The photoresist-completely-removed region corresponds to regions, except the photoresist-completely-retained region, in the pixel unit 20. The transparent conductive layer film on the photoresist-completely-removed region is removed by an etching process, and then the photoresist in the photoresist-completely-retained region is stripped off by an ashing process. As illustrated in FIG. 10, the pixel electrode 208 with a slit 209 is formed.

It can be easily known by those skilled in the art that the bottom-gate oxide TFT array substrate provided by the embodiment of the present invention may be easily modified into a top-gate oxide TFT array substrate. For instance, different from the steps of the method for manufacturing the structure of the bottom-gate oxide TFT array substrate, the method for manufacturing the top-gate oxide TFT array substrate may comprise the following steps.

S1': forming patterns of a first oxide active layer, a second oxide active layer and a common electrode on a base substrate by a first patterning process.

For instance, in the first patterning process, a transparent conductive film and an oxide active layer film are coated on the base substrate at first, and then photoresist is formed on the base substrate coated with the transparent conductive film and the oxide active layer film. After the photoresist is subjected to exposure and development via a mask, a photoresist-completely-retained region and a photoresist-completely-removed region are formed. The photoresist-completely-retained region corresponds to regions of an active layer of a first oxide TFT and an active layer of a second oxide TFT. The photoresist-completely-removed region corresponds to regions, except the photoresist-completely-retained region, in the pixel unit. The oxide active layer film on the photoresist-completely-removed region is removed by an etching process, and then the photoresist in the photoresist-completely-retained region is stripped off by an ashing process to form the patterns of the common electrode, the active layer of the first oxide TFT and the active layer of the second oxide TFT.

S2': forming a pattern of an etching barrier layer on the base substrate, obtained after the first patterning process, by a second patterning process.

For instance, in the second patterning process, an etching barrier layer film is coated on the base substrate obtained after the first patterning process at first, and then photoresist is formed on the base substrate coated with the etching barrier layer film. After the photoresist is subjected to exposure and development via a mask, a photoresist-completely-retained region and a photoresist-completely-removed region am formed. The photoresist-completely-retained region corresponds to a region of the etching barrier layer. The photoresist-completely-removed region corresponds to regions, except the photoresist-completely-retained region, in the pixel unit. The etching barrier layer film on the photoresist-completely-removed region is removed by an etching process, and then the photoresist in the photoresist-completely-retained region is stripped off by an ashing process to form the pattern of the etching barrier layer.

S3': forming patterns of a data line, a first source electrode, a first drain electrode, a second source electrode and a second drain electrode on the base substrate, obtained after the second patterning process, by a third patterning process.

For instance, in the third patterning process, a source/drain metal layer film is coated on the base substrate obtained after the second patterning process at first, and then photoresist is formed on the base substrate coated with the source/drain metal layer film. After the photoresist is subjected to exposure and development via a mask, a photoresist-completely-retained region and a photoresist-completely-removed region are formed. The photoresist-completely-retained region corresponds to regions of the data line, the first source electrode, the first drain electrode, the second source electrode and the second drain electrode. The photoresist-completely-removed region corresponds to regions, except the photoresist-completely-retained region, in the pixel unit. The source/drain metal layer film on the photoresist-completely-removed region is removed by an etching process, and then the photoresist in the photoresist-completely-retained region is stripped off by an ashing process to form the patterns of the data line, the first source electrode, the first drain electrode, the second source electrode and the second drain electrode.

S4': forming patterns of a gate insulating layer, a gate line and a common electrode line on the base substrate, obtained after the third patterning process, by a fourth patterning process.

For instance, in the fourth patterning process, a gate insulating layer film and a gate metal layer film are coated on the base substrate obtained after the third patterning process at first, and then photoresist is formed on the base substrate coated with the gate insulating layer film and the gate metal layer film. After the photoresist is subjected to exposure and development via a mask, a photoresist-completely-retained region and a photoresist-completely-removed region are formed. The photoresist-completely-retained region corresponds to a region of the gate metal layer film. The photoresist-completely-removed region corresponds to regions, except the photoresist-completely-retained region, in the pixel unit. The gate metal layer film on the photoresist-completely-removed region is removed by an etching process, and then the photoresist in the photoresist-completely-retained region is stripped off by an ashing process to form the patterns of the gate insulating layer, the gate line and the common electrode line.

S5': forming a pattern of a passivation layer on the base substrate, obtained after the fourth patterning process, by a fifth patterning process.

For instance, in the fifth patterning process, a passivation layer film is coated on the base substrate obtained after the fourth patterning process at first, and then photoresist is formed on the base substrate coated with the passivation layer film. After the photoresist is subjected to exposure and development via a mask, a photoresist-completely-retained region and a photoresist-completely-removed region are formed. The photoresist-completely-retained region corresponds to a region of the passivation layer. The photoresist-completely-removed region corresponds to regions, except the photoresist-completely-retained region, in the pixel unit. For instance, the photoresist-completely-removed region includes a gate line lead through hole and a data line lead through hole. The passivation layer film in the photoresist-completely-removed region is removed by an etching process, and the photoresist in the photoresist-completely-retained region is stripped off by an ashing process to form the pattern of the passivation layer, the gate line lead through hole and the data line lead through hole.

S6': forming patterns of pixel electrodes on the base substrate, obtained after the fifth patterning process, by a sixth patterning process.

For instance, in the sixth patterning process, a transparent conductive layer film is coated on the base substrate obtained after the fifth patterning process at first, and then photoresist is formed on the base substrate coated with the transparent conductive layer film. After the photoresist is subjected to exposure and development via a mask, a photoresist-completely-retained region and a photoresist-completely-removed region are formed. The photoresist-completely-retained region corresponds to a region of the pixel electrode. The photoresist-completely-removed region corresponds to regions, except the photoresist-completely-retained region, in the pixel unit. The transparent conductive layer film on the photoresist-completely-removed region is removed by an etching process, and then the photoresist in the photoresist-completely-retained region is stripped off by an ashing process to form the pixel electrode with a slit.

It should be noted that the method for manufacturing the oxide TFT array substrate provided by an embodiment of the present invention is only described by illustrative six patterning processes. It should not be understood that the embodiments of the present invention can only be realized by six patterning processes. Other different patterning process schedule allows the array substrate to further comprise a method for manufacturing second oxide TFTs, which should also fall within the scope of protection of the present invention. In the method for manufacturing the oxide TFT array substrate, provided by an embodiment of the present invention, second oxide TFTs are disposed on the array substrate. As the second oxide TFTs are additionally arranged on the basis of the array substrate only comprising the first oxide TFTs only, the second oxide TFT increases the off-state resistance between the pixel electrode and the data line, can inhibit the leakage path "drain electrode—oxide active layer—source electrode", and hence can improve the display quality of panels. In another aspect, the second oxide TFT connected in series with the first oxide TFT can increase the off-state resistance ($R_{off1}+R_{off2}>R_{off1}$) of the TFT and reduce the leakage current. In addition, when the oxide TFT is switched on, a signal is transmitted from the active layer of the first oxide TFT to the first drain electrode, subsequently transmitted to the second source electrode, transmitted to the second drain electrode through the active layer of the second oxide TFT, and subsequently transmitted to the pixel electrode via the passivation layer through hole in the pixel electrode. Finally, a transverse electric field is formed in a liquid crystal cell to drive liquid crystals to deflect. The deflection angle of the liquid crystals may be controlled by the control of data signals, and hence the transmittance of the panel can be affected.

It should be noted that description is given in the above embodiments by only taking the method for manufacturing the array substrate employing the oxide TFTs as an example, but the embodiments of the present invention are not limited thereto and are adapted to any case in which at least two TFTs may be connected in series to inhibit the leakage path "drain electrode—oxide active layer—source electrode". For instance, in the embodiment of the present invention, poly-Si TFTs, e.g., LTPS or HTPS TFTs, may also be adopted. Both the poly-Si TFTs and the oxide TFTs have high electron mobility, which is more helpful to realize the series connection between the TFTs. When the array substrate adopts the poly-Si TFTs, the manufacturing method of the array substrate is similar to the manufacturing method of the array substrate adopting the oxide TFTs, provided by an embodiment of the present invention. No further description will be given here.

In the array substrate, the manufacturing method thereof and the display panel, provided by at least one embodiment of the present invention, the second TFTs connected in series with the first TFTs are arranged to increase the off-state resistance between the pixel electrodes and the data lines and reduce the off-state leakage current of the TFTs. Thus, the phenomena such as flicker, crosstalk and afterimages of the display panel can be improved, and hence the display performance can be improved.

The above embodiments are only intended to illustrate the present invention but not intended to limit the present invention. Various changes and deformations may also be made by those skilled in the art without departing from the spirit and scope of the present invention. Therefore, all the equivalent technical proposals shall also fall within the scope of the present invention. The scope of protection of the present invention shall be defined b the appended claims.

The application claims priority to the Chinese patent application No. 2014 10057337.6 submitted on Feb. 19, 2014. The disclosure content of the Chinese patent application is incorporated by reference herein as part of the application.

The invention claimed is:

1. An array substrate for a liquid crystal display panel comprising: a base substrate and a gate line, a data line and a plurality of pixel units disposed on the base substrate, wherein
 each pixel unit includes a first thin-film transistor (TFT), a pixel electrode and at least one second TFT connected in series with the first TFT; and
 the pixel electrode is connected with a drain electrode of the second TFT; a source electrode of the second TFT is connected with a drain electrode of the first TFT; and a source electrode of the first TFT is connected with the data line,
 the array substrate is also provided with a common electrode and a common electrode line which are connected with each other, and the common electrode and the pixel electrode are arranged on the same layer; and both the pixel electrode and the common electrode include a slit structure.

2. The array substrate according to claim 1, wherein the first TFT and the second TFT are oxide TFTs or polycrystalline silicon (poly-Si) TFTs.

3. The array substrate according to claim 1, wherein
 active layers of the first TFT and the second TFT are disposed on the base substrate;
 the source electrode and the drain electrode of the first TFT and the source electrode and the drain electrode of the second TFT are respectively disposed on the active layers of the first TFT and the second TFT; and
 the drain electrode of the second TFT is connected with the pixel electrode, extending to the drain electrode of the second TFT, in the pixel unit.

4. The array substrate according to claim 1, wherein
 the gate line is disposed on the base substrate;
 a gate insulating layer and the active layers of the first TFT and the second TFT are disposed on the gate line;
 an etching barrier layer is disposed on the gate insulating layer and the active layers of the first TFT and the second TFT;
 the source electrode and the drain electrode of the first TFT and the source electrode and the drain electrode of the second TFT are disposed on the etching barrier layer;
 a passivation layer is disposed on the source electrode and the drain electrode of the first TFT and the source electrode and the drain electrode of the second TFT; and
 the drain electrode of the second TFT is connected with the pixel electrode, extending to the drain electrode of the second TFT, in the pixel unit.

5. The array substrate according to claim 1, wherein
 active layers of the first TFT and the second TFT are disposed on the base substrate;
 an etching barrier layer is disposed on the active layers of the first TFT and the second TFT;
 the source electrode and the drain electrode of the first TFT and the source electrode and the drain electrode of the second TFT are disposed on the etching barrier layer;
 a gate insulating layer is disposed on the source electrode and the drain electrode of the first TFT and the source electrode and the drain electrode of the second TFT;
 the gate line is disposed on the gate insulating layer;
 a passivation layer is disposed on the gate line; and
 the drain electrode of the second TFT is connected with the pixel electrode, extending to the drain electrode of the second TFT, in the pixel unit.

6. The array substrate according to claim 3, wherein the active layer is made from indium gallium zinc oxide (IGZO), indium zinc oxide (IZO), zinc oxide (ZnO) or poly-Si.

7. A display panel comprising the array substrate according to claim 1.

* * * * *